United States Patent
Tai et al.

(10) Patent No.: US 11,049,850 B2
(45) Date of Patent: Jun. 29, 2021

(54) METHODS OF BONDING THE STRIP-SHAPED UNDER BUMP METALLIZATION STRUCTURES

(71) Applicant: Taiwan Semiconductor Manufacturing Company, Ltd., Hsinchu (TW)

(72) Inventors: Chih-Hsuan Tai, Taipei (TW); Chi-Hui Lai, Taichung (TW); Ying-Cheng Tseng, Tainan (TW); Ban-Li Wu, Hsinchu (TW); Ting-Ting Kuo, Hsinchu (TW); Yu-Chih Huang, Hsinchu (TW); Chiahung Liu, Hsinchu (TW); Hao-Yi Tsai, Hsinchu (TW); Chung-Shi Liu, Hsinchu (TW); Chen-Hua Yu, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/876,471

(22) Filed: May 18, 2020

(65) Prior Publication Data

US 2020/0279837 A1 Sep. 3, 2020

Related U.S. Application Data

(62) Division of application No. 16/215,373, filed on Dec. 10, 2018, now Pat. No. 10,658,348.

(Continued)

(51) Int. Cl.
*H01L 23/00* (2006.01)
*H01L 25/16* (2006.01)

(52) U.S. Cl.
CPC .............. *H01L 25/16* (2013.01); *H01L 24/03* (2013.01); *H01L 24/05* (2013.01); *H01L 24/06* (2013.01);
(Continued)

(58) Field of Classification Search
CPC ......... H01L 24/03; H01L 24/06; H01L 24/11; H01L 24/14; H01L 24/81
See application file for complete search history.

(56) References Cited

U.S. PATENT DOCUMENTS 6,917,510 B1  7/2005  Prymak
8,361,842 B2  1/2013  Yu et al.
(Continued)

FOREIGN PATENT DOCUMENTS

CN  109755192 A  5/2019
JP  2013074054 A  4/2013
(Continued)

*Primary Examiner* — Hoai V Pham
(74) *Attorney, Agent, or Firm* — Slater Matsil, LLP

(57) ABSTRACT

A semiconductor package includes a semiconductor device including a first UBM structure, wherein the first UBM structure includes multiple first conductive strips, the first conductive strips extending in a first direction, multiple second conductive strips separated from and interleaved with the multiple first conductive strips, the second conductive strips extending in the first direction, wherein the multiple first conductive strips are offset in the first direction from the multiple second conductive strips by a first offset distance, and a substrate including a second UBM structure, the second UBM structure including multiple third conductive strips, each one of the multiple third conductive strips bonded to one of the multiple first conductive strips or one of the multiple second conductive strips.

20 Claims, 9 Drawing Sheets

Related U.S. Application Data

(60) Provisional application No. 62/737,729, filed on Sep. 27, 2018.

(52) U.S. Cl.
CPC .............. *H01L 24/16* (2013.01); *H01L 24/81* (2013.01); *H01L 2224/0237* (2013.01); *H01L 2224/0401* (2013.01); *H01L 2224/05024* (2013.01); *H01L 2224/05553* (2013.01); *H01L 2224/05624* (2013.01); *H01L 2224/06133* (2013.01); *H01L 2224/16148* (2013.01); *H01L 2224/81024* (2013.01); *H01L 2224/81815* (2013.01); *H01L 2924/19011* (2013.01); *H01L 2924/19102* (2013.01)

(56) References Cited

U.S. PATENT DOCUMENTS

| | | |
|---|---|---|
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 8,993,380 B2 | 3/2015 | Hou et al. |
| 9,281,254 B2 | 3/2016 | Yu et al. |
| 9,293,401 B2 | 3/2016 | Yoon et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 10,128,179 B2 | 11/2018 | Kim et al. |
| 10,840,227 B2 | 11/2020 | Huang et al. |
| 2011/0291288 A1 | 12/2011 | Wu et al. |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0077275 A1 | 3/2013 | Kariyazaki |
| 2013/0168848 A1 | 7/2013 | Lin et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2016/0064309 A1 | 3/2016 | Su et al. |
| 2017/0098631 A1* | 4/2017 | Kikuchi ................. H01L 24/03 |
| 2017/0188458 A1 | 6/2017 | Hsieh et al. |
| 2018/0211904 A1 | 7/2018 | Cho et al. |
| 2019/0157108 A1 | 5/2019 | Liao et al. |

FOREIGN PATENT DOCUMENTS

| | | |
|---|---|---|
| KR | 20180086154 A | 7/2018 |
| TW | 201804573 A | 2/2018 |
| TW | 201810576 A | 3/2018 |
| TW | 201830612 A | 8/2018 |

\* cited by examiner

# METHODS OF BONDING THE STRIP-SHAPED UNDER BUMP METALLIZATION STRUCTURES

PRIORITY CLAIM AND CROSS-REFERENCE

This application is a divisional of U.S. application Ser. No. 16/215,373, filed on Dec. 10, 2018, entitled "Semiconductor Devices Having a Plurality of First and Second Conductive Strips" which claims priority to U.S. Provisional Application No. 62/737,729, filed on Sep. 27, 2018, entitled "Semiconductor Devices and Methods of Forming the Same," and is related to the following co-pending and commonly assigned U.S. patent application Ser. No. 16/215,325, filed on Dec. 10, 2018, and entitled "Semiconductor Device with Multiple Polarity Groups," which applications are hereby incorporated by references in their entireties.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
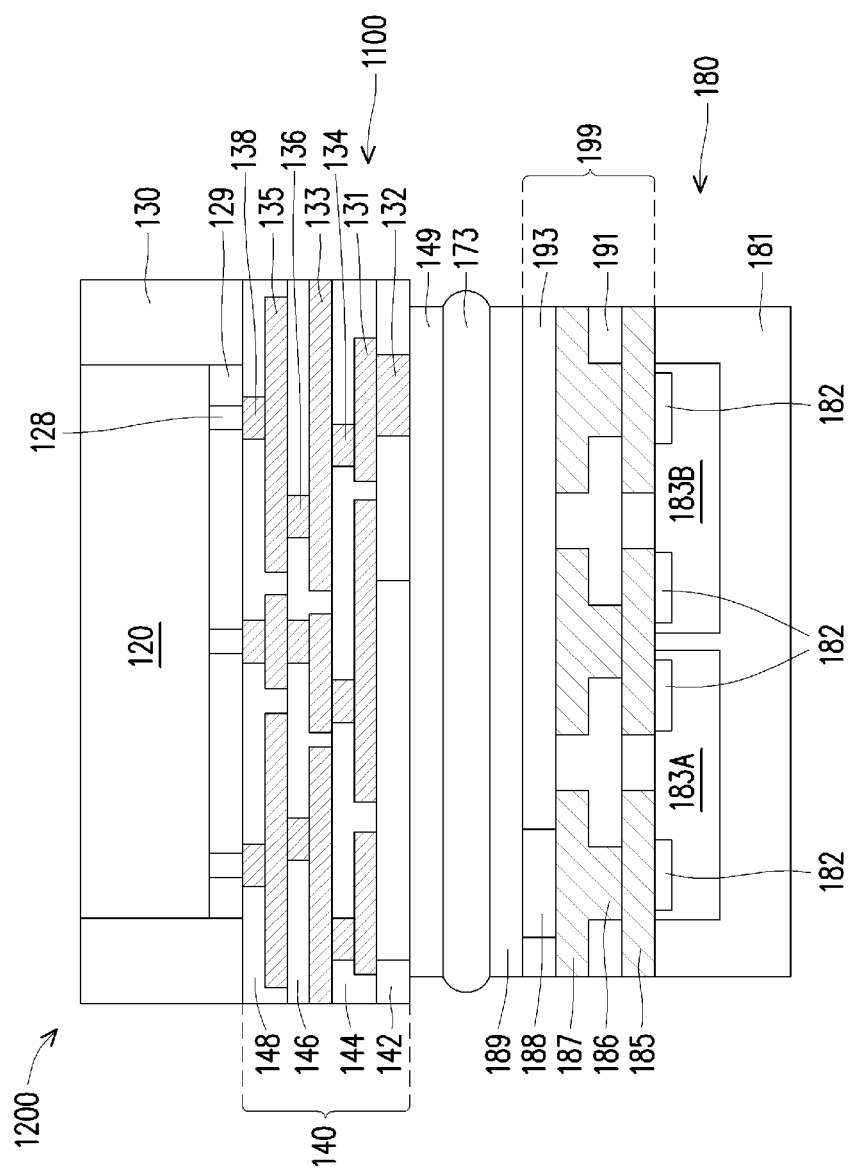
FIG. 1 illustrates a cross-sectional view of an Integrated Passive Device (IPD) bonded to an integrated fan-out (InFO) package, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of semiconductor packages, and specifically, methods and structures of semiconductor packages comprising an integrated passive device (IPD) bonded to an integrated fan-out (InFO) package. In some embodiments, the under bump metallization (UBM) structures of the IPD device and the InFO package include strip-shaped features. The strip-shaped features may have different lengths or a different arrangement in the UBM structures of the IPD device than in the UBM structures of the InFO package. In some cases, the use of different UBM structures in this manner may allow for improved bonding.

FIG. 1 illustrates a cross-sectional view of a portion of a semiconductor package 1200 according to an embodiment. The semiconductor package 1200 includes an InFO package 1100 and an IPD 180 attached to the InFO package 1100. As illustrated in FIG. 1, the InFO package 1100 includes one or more UBM structures 149 that may be bonded to one or more corresponding UBM structure 189 of the IPD 180. As shown in FIG. 1, the UBM structures 149 may be bonded to the UBM structure 189 through a solder region 173. Only one UBM structure 149 of the InFO package 1100 and only one UBM structure 189 of the IPD 180 are shown in the cross-sectional view of FIG. 1, but the InFO package 1100 may include multiple UBM structures 149 or the IPD 180 may include multiple UBM structures 189 in some embodiments. In some embodiments, the number of UBM structures 149 is the same as the number of UBM structures 189. Note that the various features shown in FIG. 1 are for illustration purpose only and not limiting, and other shapes, configurations, or arrangements are also possible. For example, the UBM structure 189, the UBM structure 149, or the soldier region 173 may include separated regions. The UBM structure 189 may be connected to the InFO package 1100 differently than shown, and the UBM structure 149 may be connected to the IPD 180 differently than shown. Various embodiments for the UBM structure 189 and the UBM structure 149 are discussed hereinafter. These and other variations of the semiconductor package 1200 are fully intended to be included within the scope of the present disclosure.

As illustrated in FIG. 1, the InFO package 1100 includes a die 120 (also referred to as a semiconductor die, or an integrated circuit (IC) die) embedded in a molding material 130, and a redistribution structure 140 formed on a front side of the die 120 having die connectors 128. The redistribution structure 140 includes electrically conductive features, such as conductive lines (e.g., 131, 133, 135) and vias (e.g., 132, 134, 136, 138), that are formed in one or more dielectric layers (e.g., 142, 144, 146, 148) of the redistribution structure 140. The UBM structure 149 may be formed over a topmost dielectric layer (e.g., 142) of the redistribution structure 140 and is electrically coupled to the redistribution structure 140. The UBM structure 149 may also be electrically coupled to one or more die connectors 128 through the redistribution structure 140. The UBM structure 149 may be configured to be bonded to the UBM structure 189 of the IPD 180, as described below.

The die 120 may include a substrate, such as a semiconductor substrate including silicon, may be doped or undoped, or may be an active layer of a semiconductor-on-insulator (SOI) substrate. The substrate may include other semiconductor materials, such as germanium, a compound semiconductor such as silicon carbide, gallium arsenic, gallium phosphide, gallium nitride, indium phosphide, indium arsenide, or indium antimonide, a combination thereof, or the like. The substrate may include a binary, ternary, or quaternary compound semiconductor, such as SiGe, GaAsP, AlInAs, AlGaAs, GaInAs, GaInP, GaInAsP, combinations thereof, or the like. Other types of substrates, such as multi-layered or substrates having a graded doping or graded composition, may also be used. Devices, such as transistors (e.g., FinFETs, MOSFETs, etc.), diodes, capacitors, resistors, oscillators, or other active or passive devices, may be formed in and/or on the semiconductor substrate and may be interconnected by interconnect structures. The interconnect structures may include, for example, metallization patterns in one or more dielectric layers on the substrate, forming an integrated circuit.

The die 120 may also include pads (not shown), such as aluminum pads, to which external connections are made. The pads may be on an "active side" (or "front side") of the die 120. A passivation film (not shown) may be formed at the front side of the die 120 and on portions of the pads. Openings may be formed extending through the passivation film to the pads, and die connectors 128, such as conductive pillars (which may include a metal such as copper), extend into the openings of the passivation film. In this manner, the die connectors 128 are mechanically and electrically coupled to the pads. The die connectors 128 may be formed by, for example, a plating process or the like. The die connectors 128 are electrically coupled to the integrated circuits of the die 120.

A dielectric material 129 may be formed on the active sides of the die 120, such as on the passivation film or the die connectors 128. The dielectric material 129 may laterally encapsulate the die connectors 128, and the dielectric material 129 may be laterally coterminous with the die 120. The dielectric material 129 may be a polymer such as polybenzoxazole (PBO), polyimide, benzocyclobutene (BCB), a nitride such as silicon nitride, an oxide such as silicon oxide, phosphosilicate glass (PSG), borosilicate glass (BSG), boron-doped phosphosilicate glass (BPSG), another type of material, or a combination thereof. The dielectric material 129 may be formed, for example, by spin coating, lamination, CVD, PVD, ALD, or the like.

Referring further to FIG. 1, the molding material 130 around the die 120 may include a material such as an epoxy, an organic polymer, a polymer (with or without a silica-based or glass filler added), or another type of material. The molding material 130 may be formed using any suitable formation method, such as wafer level molding, compressive molding, transfer molding, or the like. Although not illustrated, the molding material 130 may be formed after the die 120 is attached to a first side of a carrier, after which the molding material 130 is formed over the first side of the carrier and around the die 120. In some embodiments, conductive pillars such as through-substrate vias (TSVs) are formed over the first side of the carrier before the molding material 130 is formed.

As illustrated in FIG. 1, the redistribution structure 140 is formed over the die 120 and the molding material 130. In some embodiments, the one or more dielectric layers (e.g., 142, 144, 146, 148) of the redistribution structure 140 are formed of a material such as the examples described above for the dielectric material 129, or may be formed from another material. The one or more dielectric layers of the redistribution structure 140 may be formed by a suitable deposition process, such as spin coating, CVD, laminating, the like, or a combination thereof.

In some embodiments, the conductive features of the redistribution structure 140 include conductive lines (e.g., 131, 133, 135) and conductive vias (e.g., 132, 134, 136, 138) formed of a suitable conductive material such as copper, titanium, tungsten, aluminum, a combination, or the like. In some embodiments, the redistribution structure 140 may be formed by forming a dielectric layer, forming openings in the dielectric layer to expose underlying conductive features, forming a seed layer over the dielectric layer and in the openings, forming a patterned photoresist with a designed pattern over the seed layer, plating (e.g., electroplating or electroless plating) the conductive material in the designed pattern and over the seed layer, and removing the photoresist and portions of seed layer on which the conductive material is not formed. In some embodiments, the redistribution structure 140 may be formed using a damascene process or a dual-damascene process, though other methods of forming the redistribution structure 140 are also possible and are fully intended to be included within the scope of the present disclosure.

The dielectric layers and the conductive features in the redistribution structures 140 of FIG. 1 are intended as non-limiting examples. For example, other numbers of the dielectric layers and other numbers of layers of the conductive features are also possible and are fully intended to be included within the scope of the present disclosure. The discussion herein may refer to the redistribution layer (RDL) 131 as the topmost RDL of the redistribution structure 140, with the understanding that when other numbers of RDLs are used in the redistribution structure 140, the topmost RDL refers to the RDL furthest from the die 120.

FIG. 1 also illustrates the UBM structure 149 formed over the InFO package 1100 and electrically coupled to the redistribution structure 140. In some embodiments, the UBM structure 149 includes one or more layers of one or more conductive materials, such as silver, gold, aluminum, palladium, nickel, nickel alloys, tungsten alloys, chromium, chromium alloys, the like, another metallic material, or combinations thereof. In some embodiments, the UBM structure 149 includes three layers of conductive materials, such as a layer of titanium, a layer of copper, and a layer of nickel. However, there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBM structure 149. Any suitable materials or layers of material that may be used for the UBM structure 149 are fully intended to be included within the scope of the present disclosure. In some cases, the UBM structure 149 may include an adhesion layer, a barrier layer and a wetting layer, which may be arranged in that order.

In some embodiments, the UBM structure 149 may be created by forming the openings in the topmost dielectric layer (e.g., 142) of the redistribution structure 140 to expose conductive features (e.g., copper lines or copper pads) of the redistribution structure 140. After the openings are formed, the material of the UBM structure 149 may be formed in the openings, the material of the UBM structure 149 having electrical contact with the exposed conductive features. For example, the UBM structures 149 may be created by forming each layer of the UBM structure 149 over the topmost dielectric layer (e.g., 142) and along the interior of the openings through the topmost dielectric layer to the exposed conductive features of the redistribution structure 140. The forming of each layer may be performed using a plating process, such as electroplating or electroless plating, although other processes of formation, such as sputtering, evaporation, or PECVD process, may alternatively be used.

As shown in FIG. 1, the IPD 180 may include a substrate 181 and one or more passive devices 183 (e.g., 183A and 183B). The passive devices 183 may include capacitors, resistors, inductors, or other passive devices, and may be formed in the substrate 181 or on the substrate 181. Passive devices 183A and 183B shown in FIG. 1 are illustrative examples, and the passive devices 183 may include more, fewer, or different passive devices in other embodiments. In some embodiments, the IPD 180 includes an interconnect structure 199, which includes dielectric layers (e.g., 191, 193) and metallization layers (e.g., 185, 187) formed in the dielectric layers. In addition, the interconnect structure 199 also includes vias (e.g., 186,188) formed in the dielectric layers 191 and 193. The UBM structure 189 may be formed over the topmost dielectric layer (e.g., 193) of the IPD 180. The UBM structure 189 is electrically coupled to the passive devices 183 through the interconnect structure 199. As illustrated in FIG. 1, the UBM structure 189 may be bonded to the UBM structure 149 by, e.g., solder regions 173. In some embodiments, the solder regions 173 have a thickness between about 0.5 μm and about 250 μm.

The substrate 181 of the IPD 180 may be a same or similar substrate as those described above for substrate of the die 120, or may be a different type of substrate. Each of the passive devices 183 may have pads 182, such as copper pads or aluminum pads, that are used for electrically coupling the passive devices 183 to electrical circuits external to the passive devices 183. The formation of the interconnect structure 199 may use any suitable method, such as the method described above for forming the interconnect structure of the die 120.

As illustrated in FIG. 1, the metallization layer 185 is formed over and electrically coupled with the passive devices 183. The metallization layer 185 may be, for example, conductive lines connected to the pads 182. The metallization layer 187 may be formed over the dielectric layer 191, and the UBM structure 189 may be formed over the topmost dielectric layer (e.g., 193) of the interconnect structure 199. Vias 186 may be formed between and electrically couple the metallization layers 185 and 187, and vias 188 may be formed between and electrically couple the metallization layer 187 and the UBM structure 189. Note that not all of the features of the IPD 180 are visible in the cross-sectional view of FIG. 1. For example, an additional dielectric layer may be interposed between the metallization layer 185 and the substrate 181. In addition, the UBM structure 189 and the various electrical connections illustrated in FIG. 1 are illustrative examples and are not limiting. As discussed hereinafter, various designs of the UBM structure 189 and various electrical connections between the UBM structure 189 and the interconnect structure 199 are possible. These and other modifications are fully intended to be included within the scope of the present disclosure.

The interconnect structure 199 in FIG. 1 has two dielectric layers 191,193 and two metallization layers 185,187 as illustrative examples. Other numbers of dielectric layers, other numbers of metallization layers, and other numbers of vias are also possible and are fully intended to be included within the scope of the present disclosure. The discussion herein may refer to the metallization layer 187 as the topmost metallization layer (e.g., furthest from the substrate 181) of the interconnect structure 199, and may refer to the dielectric layer 193 as the topmost dielectric layer of the interconnect structure 199, with the understanding that when other numbers of dielectric layers and other numbers of metallization layers are used in the interconnect structure 199, the topmost metallization layer and the topmost dielectric layer refer to the metallization layer and the dielectric layer of the interconnect structure 199 that are furthest from the substrate 181, respectively.

Figure 2A:
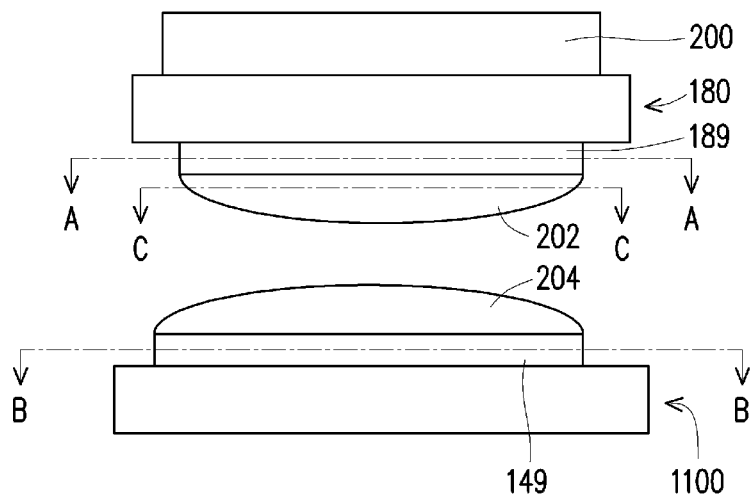
FIGS. 2A-B illustrate cross-sectional views of intermediate steps in the bonding of an IPD to an InFO package, in accordance with some embodiments.
Figure 2B:
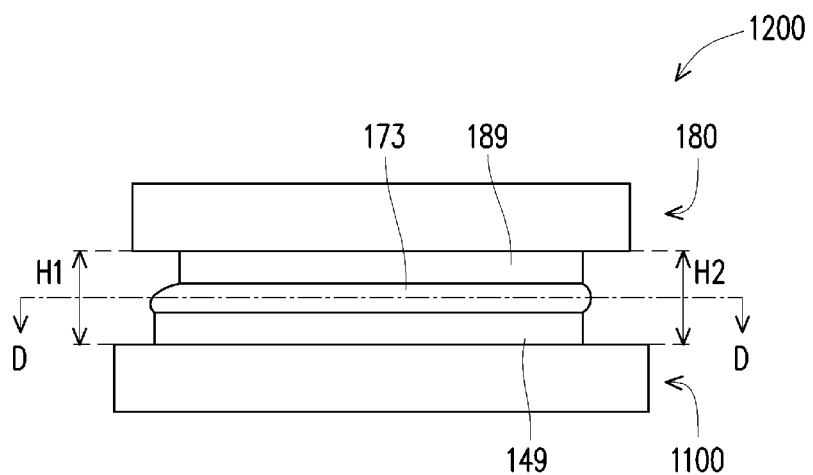

FIGS. 2A-B illustrates cross-sectional views of intermediate steps in the bonding of an IPD 180 to an InFO package 1100 to form a semiconductor package 1200 according to an embodiment. The IPD 180 shown in FIGS. 2A-B includes a UBM structure 189, which may be similar to the IPD 180 described previously. The InFO package 1100 shown in FIGS. 2A-B includes a UBM structure 149, which may be similar to the InFO package 1100 described previously. FIG. 2A shows the IPD 180 being held by a bond head 200 as part of a pick-and-place process. In other embodiments, other techniques may be used to bond the IPD 180 to the InFO package 1100.

As shown in FIG. 2A, a solder 202 is formed on the UBM structure 189 of the IPD 180. The material of the solder 202 may include a eutectic material, and the use of the word "solder" herein includes both lead-based and lead-free solders, such as Pb—Sn compositions for lead-based solder, lead-free solders including InSb, tin, silver, and copper ("SAC") compositions, and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free conductive materials such as solder balls may be formed from SnCu compounds as well, without the use of silver (Ag). Lead-free solder may also include tin and silver, Sn—Ag, without the use of copper. These are examples, and other types or compositions of the solder 202 may be used. The solder 202 may be formed on the UBM structure 189 using techniques as known in the art.

In FIG. 2A, a flux material 204 is formed on the UBM structure 149 of the InFO package 1110. The flux material 204 may be applied to the surfaces of the UBM structure 149 by, e.g., a jetting process, a flux stencil process, or another process, and may be formed to a thickness of between about 1 μm and about 100 μm. The flux material 204 may be, e.g., a no-clean flux or another type of flux. In some cases, the flux material 204 includes a solder material or solder paste.

In some embodiments, flux material 204 includes a material that may improve a connection of a subsequently formed solder region 173 over the UBM structure 149 or the UBM structure 189. For example, the flux material 204 may improve the connection by deoxidizing a native oxide layer on the UBM structure 149 or the UBM structure 189. The flux material 204 may also have other properties or dimensions or include other types of materials. In some cases, a flux material similar to the flux material 204 may also be formed on the UBM structure 189 of the IPD 180.

FIG. 2B shows the IPD 180 bonded to the InFO package 1100. In some embodiments, the UBM structure 149 may be aligned to the UBM structure 189 during the bonding procedure, within processing tolerances. FIG. 2B also shows the IPD 180 and the InFO package 1100 after a reflow process is performed on the solder 202, forming solder region 173. The solder region 173 bonds and electrically connects the UBM structure 189 of the IPD 180 to the UBM structure 149 of the InFO package 1100. In some cases, other processing steps may be performed after placement of the IPD 180 on the InFO package 1100 but prior to performing the reflow process. For example, other processing steps may be performed on parts of the semiconductor package 1200 that may or may not be shown in FIGS. 2A-B.

In some embodiments, the reflow process includes heating the solder 202 to a predetermined temperature, e.g., to a melting point of the material of the solder 202. During the reflow process, the solder 202 undergoes a wetting process that causes adhesion of the solder 202 to the UBM structure 189 and the UBM structure 149. In some cases, the reflow process may cause the solder 202 to spread on the UBM structure 189 or the UBM structure 149. In some embodiments, a portion of the flux material 204 is left remaining around the edges of solder region 173 after the reflow process. In some embodiments, the remaining flux material (not shown) may then be removed using a cleaning process.

Figure 3A:
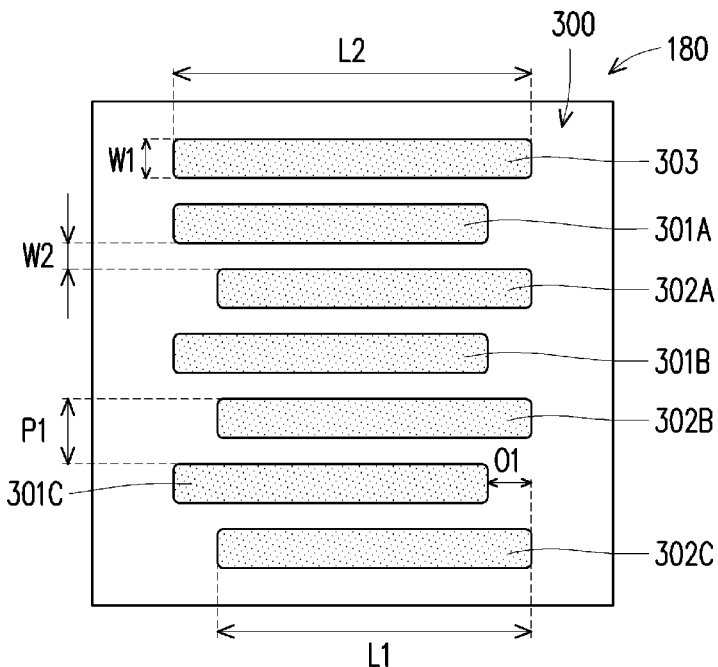
FIGS. 3A-C illustrate plan views of patterns of Under-Bump Metallization (UBM) structures, in accordance with some embodiments.
Figure 3B:
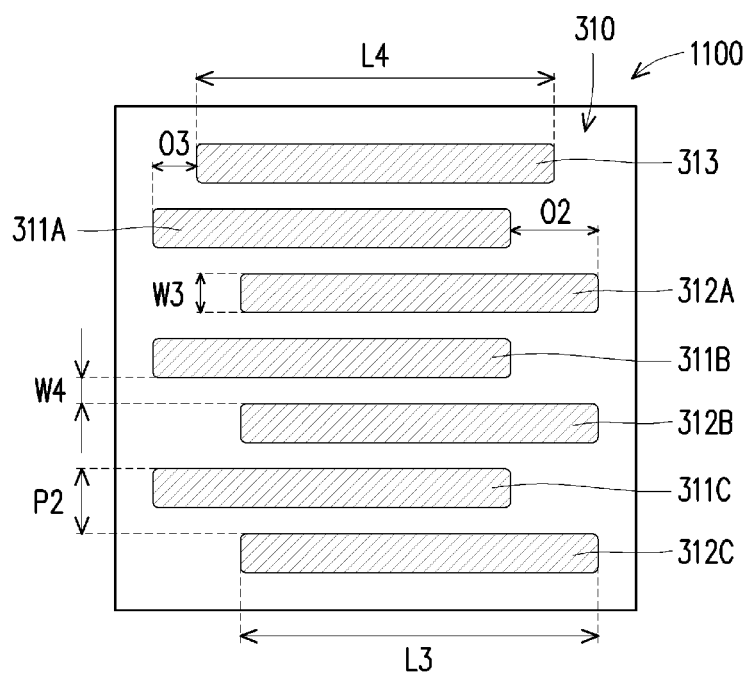
Figure 3C:
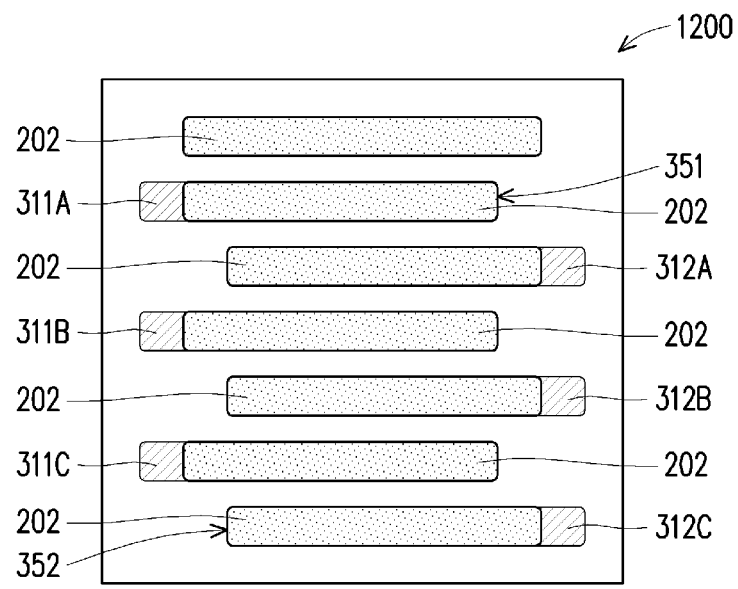

Turning to FIGS. 3A-C, plan views of a UBM pattern 300 and a UBM pattern 310 are shown, according to an embodiment. The plan view of FIG. 3A is indicated by view A-A shown in FIG. 2A, the plan view of FIG. 3B is indicated by view B-B shown in FIG. 2A, and the plan view of FIG. 3C is indicated by view C-C shown in FIG. 2A (e.g., showing an overlapping view of the UBM pattern 300 and the UBM pattern 310). The UBM pattern 300 includes multiple UBM structures, and the UBM pattern 310 also includes multiple UBM structures, as described in greater detail below. The UBM pattern 300 is configured to be bonded to the UBM pattern 310, e.g., by a solder region 173. In FIGS. 3A-C, some features are not shown for clarity. Some or all of the UBM pattern 300 or the UBM pattern 310 may be similar to the UBM structure 189 of the IPD 180 or may be similar to the UBM structure 149 of the InFO package 1100, as described previously. While the UBM patterns 300, 310 and other patterns of UBM structures described below may be disposed on the IPD 180 or on the InFO package 1100 in other embodiments, for clarity the UBM pattern 300 is described as being disposed on the IPD 180 and the UBM pattern 310 is described as being disposed on the InFO package 1100. The UBM patterns 300, 310 include multiple separated elongated or strip-shaped UBM structures, referred to herein as "strips," although in some embodiments the UBM structures described herein may have features that are not "strip-shaped." As described below, the UBM pattern 300 and the UBM pattern 310 each include sets of strips having different lengths or positions relative to strips of the same UBM pattern or relative to strips of another UBM pattern. The arrangements of strips shown in FIGS. 3A-C and other figures are illustrative examples, and the UBM patterns described herein may have more strips, fewer strips, or different strip characteristics, sizes, or arrangements than shown without deviating from the scope of this disclosure.

Dimensions and relative dimensions described herein are assumed to be within processing tolerances. Additionally, while the UBM patterns, UBM structures, and techniques herein are described in the context of an IPD being bonded to an InFO package, the UBM patterns, UBM structures, and techniques may be used for bonding other structures, packages, devices, ICs, wafers, and the like, and all such contexts are within the scope of this disclosure.

The UBM pattern 300 shown in FIG. 3A includes strips 301A-C, 302A-C, and 303. The UBM pattern 310 shown in FIG. 3B includes strips 311A-C, 312A-C, and 313. In some cases, the strips 301A-C, the strips 302A-C, the strips 311A-C, and the strips 312A-C may each be considered different sets of strips. In some embodiments, a UBM pattern may include more sets of strips than shown. In the embodiment shown in FIG. 3A, the strips 301A-C and 302A-C have the same length L1 and the same width W1. The strip 303 has a length L2 and shares the same width W1. While L2 is shown in FIG. 3A to be different than length L1, L2 may be the same as L1 in other embodiments. In some embodiments, the length L1 may be between about 10 μm and about 1000 μm and the width W1 may be between about 10 μm and about 1000 μm. In some embodiments, the strips of the UBM pattern 300 may have a width/length ratio between about 1:1 and about 1:100, such as about 1:8.5. In some embodiments, the strips of the UBM pattern 300 may be separated by a width W2 between about 10 μm and about 1000 μm, and may have a pitch P1 of adjacent strips between about 20 μm and about 2000 μm. In some embodiments, the strips of the UBM pattern 300 have a "staggered" arrangement such that one set of strips (e.g., 301A-C) are offset in a lengthwise direction relative to another set of strips (e.g., 302A-C), with strips of one set being interleaved with strips of the other set. For example, as shown in FIG. 3A, the strips 301A-C have an offset of O1 relative to the strips 302A-C. In some embodiments, the offset O1 between sets of strips may be between about 10 μm and about 1000 μm. In other words, the ends of one set of strips proximal an edge of the IPD 180 are closer to that edge than the ends of the other set of strips that are proximal that edge. As shown in FIG. 3A, the UBM pattern 300 also includes an example additional strip 303 that has different dimensions than strips 301A-C or 302A-C, and that has a left end aligned to the left ends of strips 301A-C and a right end aligned to the right ends of strips 302A-C. Strip 303 is shown as an example for illustrative purposes, and in some embodiments, strip 303 may be omitted, or other additional strips having different lengths or offsets may be present.

Turning to FIG. 3B, the strips 311A-C and 312A-C of the UBM pattern 310 have the same length L3 and the same width W3. The strip 313 has a length L4, shown in FIG. 3B to be the same as length L3, but L4 may be different than L3 in other embodiments. In some embodiments, the length L3 may be between about 10 μm and about 1000 μm and the width W3 may be between about 10 μm and about 1000 μm. In some embodiments, the strips of the UBM pattern 310 may have a width/length ratio between about 1:1 and about 1:100, such as about 1:8.5. In some embodiments, the length L3 is greater than the length L2. In some embodiments, the strips of the UBM pattern 310 may be separated by a width W4 between about 10 μm and about 1000 μm, and may have a pitch P2 of adjacent strips between about 20 μm and about 2000 μm. In some embodiments, the pitch P2 is the same as the pitch P1 of the UBM pattern 300, or the width W3 is the same as the width W1 of the UBM pattern 300. In some embodiments, the strips of the UBM pattern 310 have a staggered arrangement such that one set of strips (e.g., 311A-C) are offset in a lengthwise direction relative to another set of strips (e.g., 312A-C), with strips of one set being interleaved with strips of the other set. As shown in FIG. 3B, the strips 311A-C have an offset of O2 relative to the strips 312A-C. In some embodiments, the offset O2 between sets of strips may be between about 10 µm and about 1000 µm. The UBM pattern 310 may also include one or more additional strips having different lengths or offsets, for example, the strip 313 may have a different length L4 than strips 311A-C or 312A-C or may itself have an offset O3 relative to the strips 311A-C and 312A-C. In some embodiments, the offset O3 may be between about 10 µm and about 1000 µm. In some embodiments, strip 313 may be omitted, or other additional strips having different lengths or offsets may be present. In some embodiments, the strip 313 has the same length or the same width as the strip 303 of the UBM pattern 300. That is, in those embodiments, L4 is equal to L2 and the strip 313 shares the same width W1.

FIG. 3C shows the solder 202 formed on the UBM pattern 300 and the UBM pattern 300 having been aligned to the UBM pattern 310, according to an embodiment. FIG. 3C shows the view indicated as C-C in FIG. 2A, with striped regions indicating the UBM pattern 310 and dotted regions indicating the UBM pattern 310 with solder 202. Each strip of the UBM pattern 300 may correspond to a strip of the UBM pattern 310. For example, strip 301A corresponds to strip 311A, strip 302A corresponds to strip 302A, etc. During the bonding process, each strip of the UBM pattern 300 is bonded to its respective corresponding strip of the UBM pattern 310. In the embodiment shown, each of the strips 301A-C and 302A-C has an end that is aligned to an end of its corresponding strip 311A-C and 312A-C. For example, the end of strip 301A is aligned to the end of corresponding strip 311A at the location 351 shown in FIG. 3C, and the end of strip 302C is aligned to the end of corresponding strip 312C at the location 352 shown in FIG. 3C. As shown in FIG. 3C, the length L1 of the strips 301A-C and 302A-C is less than the length L3 of the strips 311A-C, and thus portions of each of strips 311A-C and 312A-C are not covered by the solder 202 and are thus "exposed." In some embodiments, the exposed portions of strips 311A-C and 312A-C may be located at opposite ends of each strip. In the example shown in FIG. 3C, the ends of the strips 311A-C close to one edge of the IPD 180 are exposed, and the ends of the strips 312A-C close to the opposite edge of the IPD 180 are exposed. Which portions of which strips are exposed and the dimensions or locations of the exposed portions may be controlled by controlling the lengths, offsets, or positions of the strips of the UBM pattern 300 relative to the lengths, offsets, or positions of the strips of the UBM pattern 310. In the embodiment shown in FIGS. 3A-C, strip 303 is aligned to strip 313 and is the same size as strip 313, and thus strip 313 does not have an exposed portion.

Figure 4:
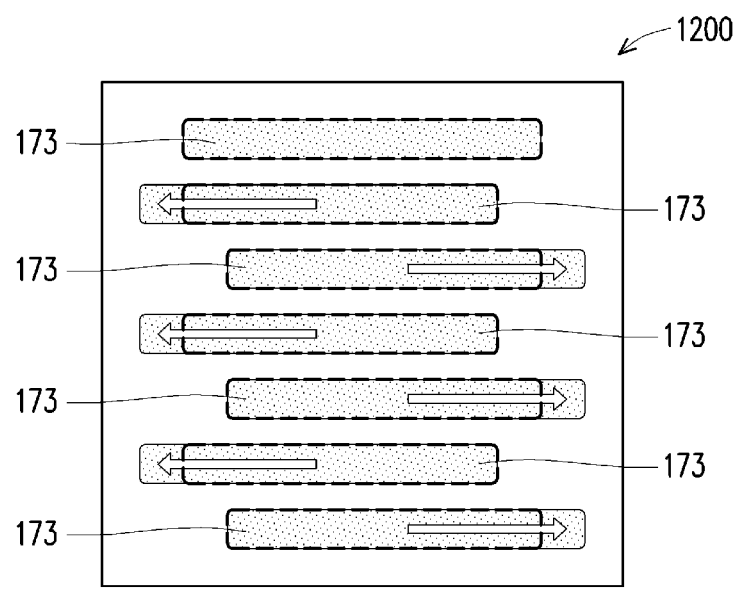
FIG. 4 illustrates a plan view of an intermediate step in the bonding of an IPD to an InFO package, in accordance with some embodiments.

FIG. 4 shows the UBM structures 300 and 310 during a bonding process, according to an embodiment. FIG. 4 shows the view indicated as D-D in FIG. 2B, with dotted regions indicating solder regions 173, and with the UBM pattern 300 being shown by the dotted lines. In FIG. 4, the UBM pattern 300 is placed on the UBM pattern 310 of the InFO package 1100, similar to FIG. 3C. A reflow process is then performed on the solder 202, forming solder regions 173. The reflow process may be similar to that described above with respect to FIG. 2B. During the reflow process, the solder 202 melts and, due to wetting, spreads over the exposed portions of the strips 311A-C in a first direction and over the exposed portions of the strips 312A-C in an opposite second direction, indicated by the arrows in FIG. 4. Because of the adhesion of the wetted solder 202 to the UBM structures 300 and 310, a wetting force is imparted on each strip 301A-C and 302A-C by the solder 202 in the same direction on each strip as the solder 202 spreads. Additionally, due to the staggered arrangement of the strips, the amount of solder 202 spreading in the first direction is about equal to the amount of solder 202 spreading in the opposite second direction. Thus, the wetting force imparted on the IPD 180 is approximately balanced, with the wetting force from one set of strips in the first direction about equal and opposite to the wetting force from the other set of strips in the opposite second direction. In some embodiments, the number of strips configured to have solder 202 spread in one direction is the same as the number of strips configured to have solder 202 spread in the opposite direction.

In some cases, the IPD 180 may have a tilted orientation ("tilt") relative to the InFO package 1100 after the reflow process is performed, and the balanced wetting force due to the arrangement of strips can reduce the amount of tilt that the IPD 180 has after the reflow process. The tilt of the IPD 180 may be due to uneven solder spreading, uneven heating, misalignment, or other reasons. In some cases, a tilted IPD 180 after bonding to an InFO package 1100 may cause the distance (e.g., H1 as shown in FIG. 2B) between one edge of the IPD 180 and the InFO package 1100 to be different than the distance (e.g., H2 as shown in FIG. 2B) between the opposite edge of the IPD 180 and the InFO package 1100. In some cases, a tilted IPD 180 can reduce the quality of the solder region 173 bonding the IPD 180 to the InFO package 1100. For example, a tilt may cause the solder region 173 to have excessive formation of inter-metallic compound (IMC), cold joint problems, cracking of the solder region 173, poor adhesion of the solder region 173 to the UBM structure 189 or UBM structure 149, or other issues that may degrade device performance. In this manner, the use of the patterns of UBM structures as described herein may reduce the difference between the distances H1 and H2 due to tilting of the IPD 180. In some embodiments, the use of the patterns of UBM structures as described herein can produce a difference between H1 and H2 of less than about 1000 µm. In this manner, the amount of IPD 180 tilt may be lessened and thus the bond between the IPD 180 and the InFO 110 may be improved.

The UBM structures 300 and 310 shown in FIGS. 3A-4 are examples, and other patterns or configurations of strips are possible. FIGS. 5A-B and 6A-D illustrate some illustrative examples of patterns of strips according to some embodiments, but other patterns are possible. For example, each pattern of strips may be used for the IPD 180 or the InFO package 1100. In some embodiments, features of different strip patterns may be combined. For example, both segmented and unsegmented strips (described below) may be used in the same UBM pattern. Additionally, strips of different lengths, widths, offsets, or other characteristics may be combined in the same UBM pattern. A UBM pattern may also include two or more sets of strips having the same characteristics, such as a set of segmented strips interleaved with a set of unsegmented strips. In some embodiments, a UBM pattern of the IPD 180 may have strips with different characteristics than a UBM pattern of the InFO package 1100. In some embodiments, different sets of strips A, B, and C may be interleaved in different arrangements, such as an "AABBAABB" arrangement, an "ABCABC" arrangement, or another arrangement. These and other configurations or combinations of configurations are considered within the scope of this disclosure.

Figure 5A:
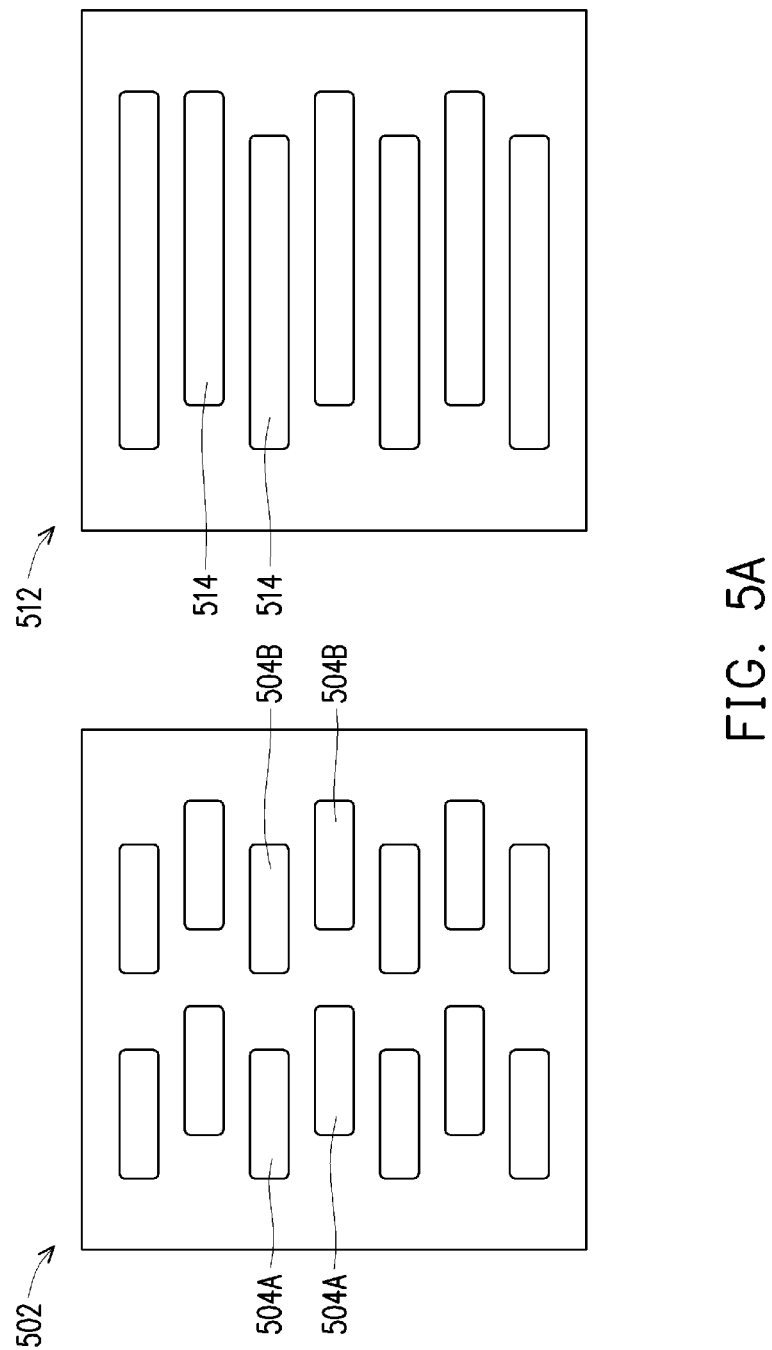
FIGS. 5A-B illustrate plan views of patterns of UBM structures, in accordance with some embodiments.

FIG. 5A shows a UBM pattern 502 having segmented strips and a UBM pattern 512 without segmented strips, according to an embodiment. The UBM structures of the UBM pattern 502 may be bonded to the UBM structures of the UBM pattern 512 or other UBM structures. The UBM pattern 502 includes UBM structures having segmented strips, in which each strip is divided into separated segments. For example, each strip shown in FIG. 5A includes a first segment 504A and a second segment 504B. The segments of a strip may be electrically connected or coupled, for example through an RDL or interconnect. In other cases, one or more segments of a strip may be electrically isolated, for example, a segment may be a "dummy" segment that remains electrically floating or otherwise electrically isolated after the bonding process. In some embodiments, the segments may be separated by a distance between about 10 µm and about 1000 µm. In some embodiments, a strip may have more than two segments, and the segments of a strip may different lengths or have separations of different distances. The segmented strips 504A/B of the UBM pattern 502 shown in FIG. 5A are shown having offsets, but in other cases the segmented strips may not have offsets. In some cases, the positions or sizes of the separations within some strips may have offsets relative to other strips. In some cases, both a UBM pattern on the IPD 180 and a UBM pattern on the InFO package 1100 may have segmented strips. In some embodiments, the separations of the segmented strips 504A/B of the UBM pattern 502 correspond to exposed portions of the strips 514 of the UBM pattern 512, though the strips 514 may also have additional exposed portions. In some embodiments, the solder 202 is formed on the segmented strips 504A/B and provides a balanced wetting force when expanding into the exposed portions of the strips 514 during a reflow process.

Figure 5B:
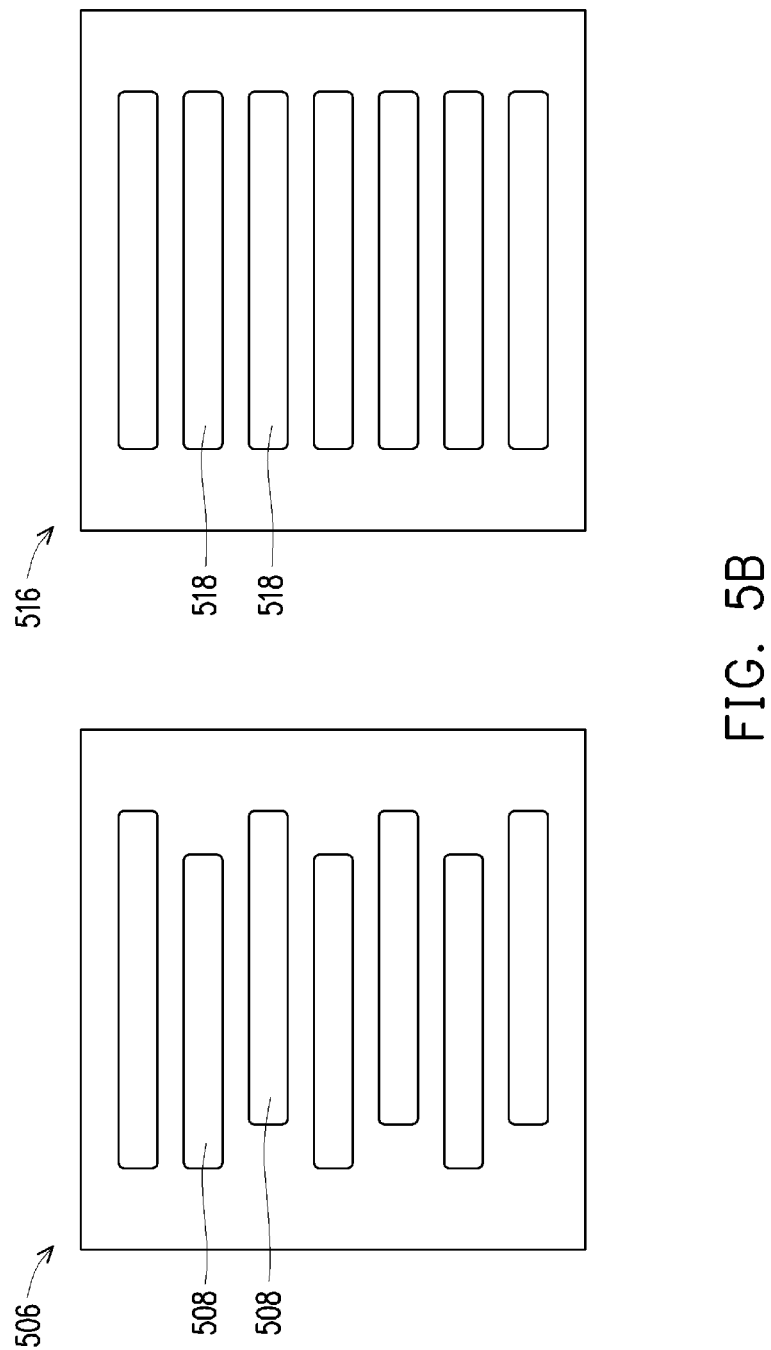

FIG. 5B shows a UBM pattern 506 with offsets and a UBM pattern 516 without offsets according to an embodiment. The UBM structures of the UBM pattern 516 may be bonded to the UBM structures of the UBM pattern 506 or other UBM structures. As shown in FIG. 5B, the UBM pattern 506 includes offset strips 508, but the UBM pattern 516 includes strips 518 that do not have offsets. In some embodiments, the length of the strips 508 is less than the length of the strips 518 and thus the strips 518 have exposed portions during the reflow process. In some embodiments, the solder 202 is formed on the strips 508 and provides a balanced wetting force when expanding into the exposed portions of the strips 518 during a reflow process.

Figure 6A:
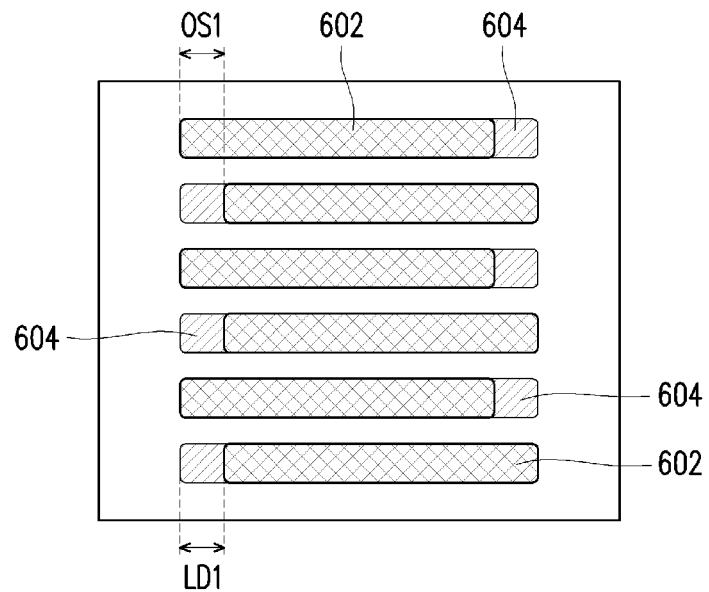
FIGS. 6A-D illustrate plan views of patterns of UBM structures, in accordance with some embodiments.
Figure 6B:
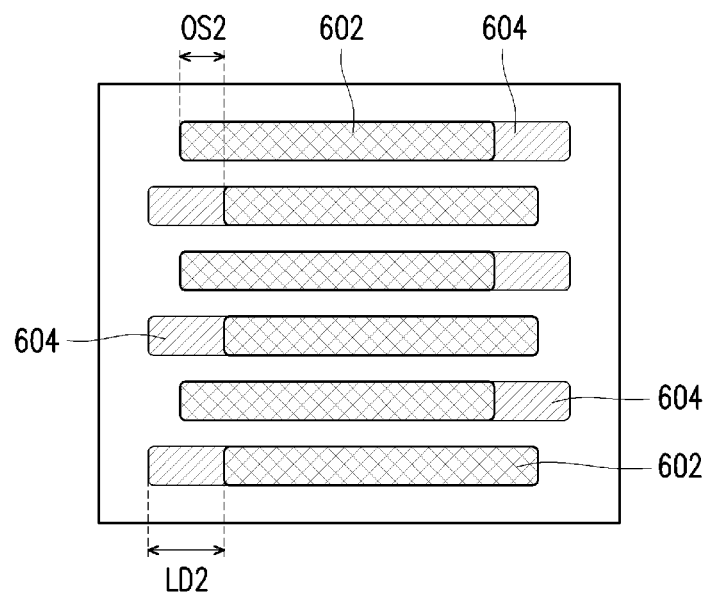
Figure 6C:
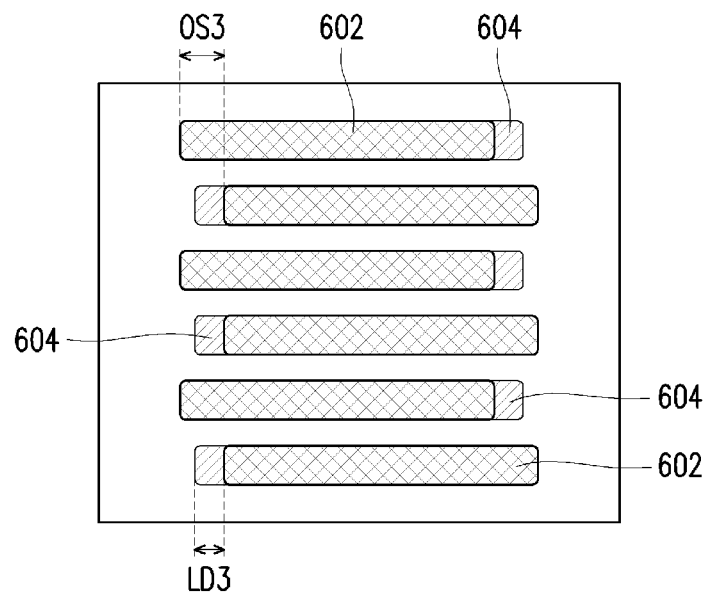
Figure 6D:
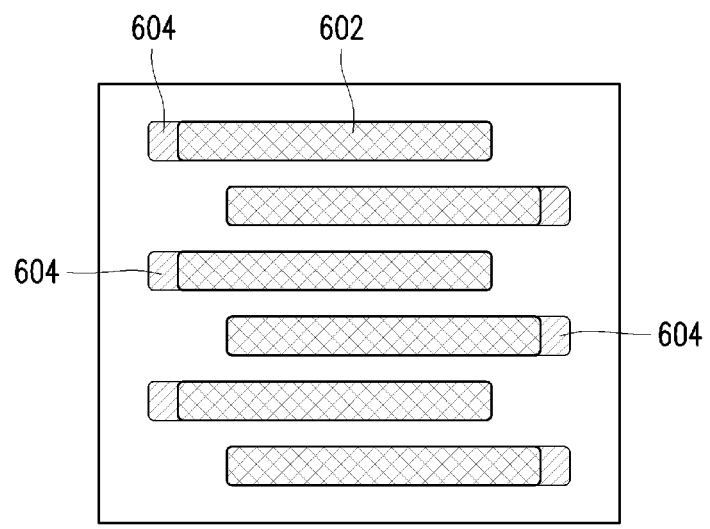

FIGS. 6A-D show plan views of a first UBM pattern having strips 602 placed over a second UBM pattern having strips 604, according to some embodiments. The plan views of FIGS. 6A-D are similar to that of FIG. 3C, and the first UBM pattern and second UBM pattern may be similar to previously described UBM patterns or UBM structures. In Figured 6A-D, striped regions indicate the strips 604 of the second UBM pattern, and cross-hatched regions indicate where the strips 602 of the first UBM pattern completely overlap the strips 604 of the second UBM pattern. In FIG. 6A, the strips 602 have a length that is less than the length of the strips 604 by a length difference LD1. Alternating strips 602 are also offset from each other by an offset separation OS1. In the embodiment shown in FIG. 6A, the length difference LD1 is approximately equal to the offset separation OS1. However, a length difference between strips of two UBM patterns may be different than the offset separation between strips of one of the UBM patterns. For example, in FIG. 6B, the offset separation OS2 of the strips 602 is less than the length difference LD2 between strips 602 and 604. As shown, a greater length difference may have larger exposed regions and thus produce larger wetting forces during reflow. In FIG. 6C, the offset separation OS3 of the strips 602 is greater than the length difference LD3 between strips 602 and 604. In the example configuration shown in FIG. 6C, ends of strips 604 and 602 that are coaligned extend in a lengthwise direction beyond ends of strips 604 that are exposed. FIG. 6D shows an example configuration in which an offset separation of strips 602 or strips 604 is greater than a length difference between strips 602 and strips 604. Each strip 602 or 604 may have a proximal end that is closer in a lengthwise direction to the center of the UBM pattern than a distal end of the strip 602 or 604. In the example of FIG. 6D, the proximal end of each strip 604 is coaligned to the proximal end of each strip 602, and the distal end of each strip 604 is exposed. As shown in FIGS. 4-6D, different configurations of UBM patterns, UBM structures, or strips are possible. In this manner, one or both of the UBM structures of the UBM patterns that are bonded together may be configured for a particular application or process.

Figure 7:
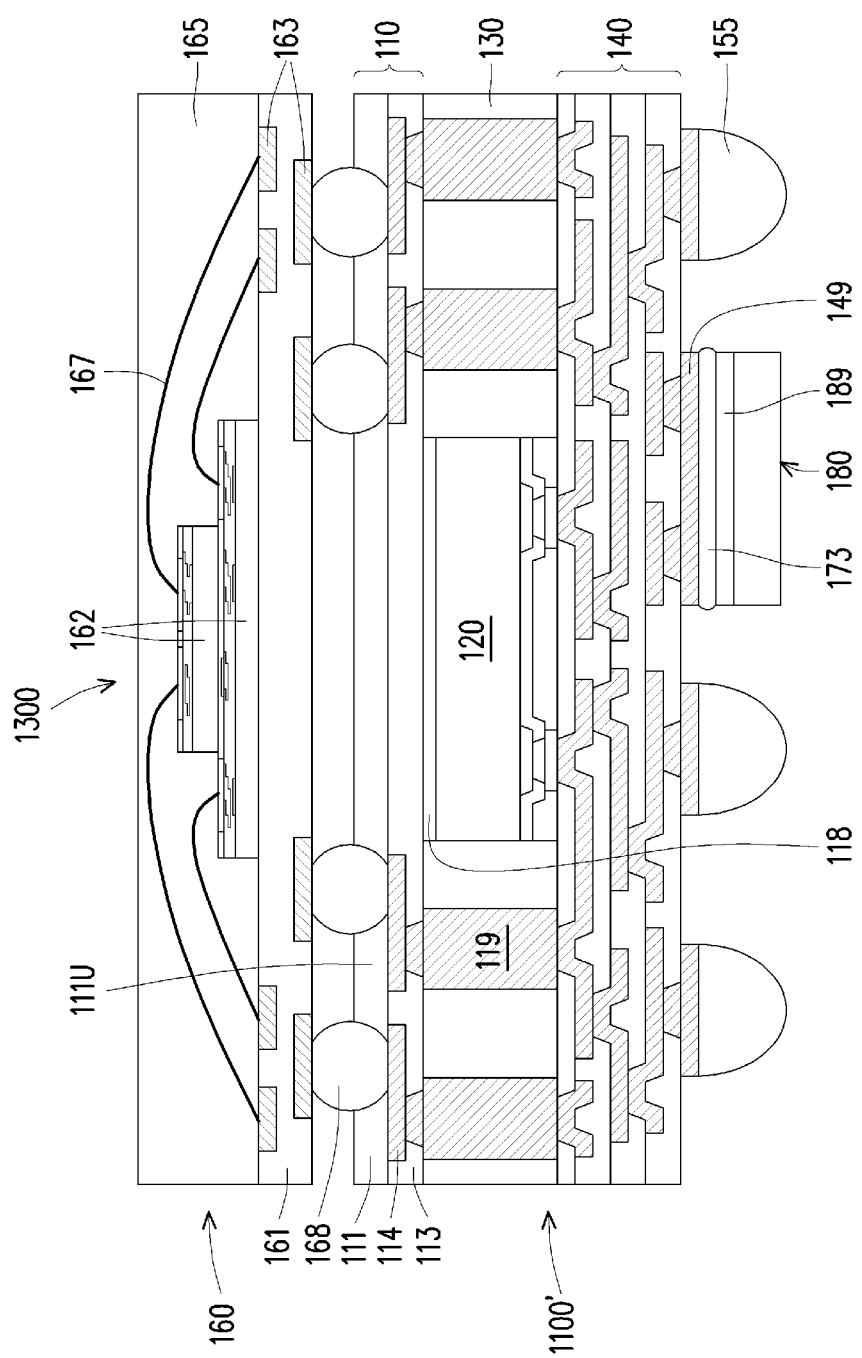
FIG. 7 illustrates a cross-sectional view of a semiconductor package, in accordance with some embodiments.

FIG. 7 illustrates a cross-sectional view of a semiconductor package 1300 including bottom package 1100', a top package 160, and an IPD 180, in some embodiments. The semiconductor package 1200 illustrated in FIG. 1 may correspond to a portion of the semiconductor package 1300 illustrated in FIG. 7, wherein like reference numerals refer to like elements.

In FIG. 7, an IPD 180, which may be similar to an IPD 180 described previously, is attached to a bottom package 1100', which may be an InFO package similar to InFO package 1100 described previously. The bottom package 1100' has a die 120 between a front side redistribution structure 140 and a backside redistribution structure 110. The front side redistribution structure 140 may be the same or similar to the redistribution structure 140 of FIG. 1, and the backside redistribution structure 110 include conductive features (e.g., conductive lines 114 and vias) formed in one or more dielectric layers (e.g., 111,113). A molding material 130 is formed between the front side redistribution structure 140 and the backside redistribution structure 110. Conductive pillars 119, such as copper pillars or TSVs, are formed in the molding material 130. The conductive pillars 119 electrically couple the front side redistribution structure 140 with the backside redistribution structure 110.

As shown in FIG. 7, a top package 160, which may be a memory package, is bonded to the bottom package 1100' through conductive joints 168. As illustrated in FIG. 7, the top package 160 has a substrate 161 and one or more semiconductor dies 162 (e.g., memory dies or other devices) attached to an upper surface of the substrate 161. In some embodiments, the substrate 161 includes silicon, gallium arsenide, silicon on insulator ("SOI") or other similar materials. In some embodiments, the substrate 161 is a multiple-layer circuit board. In some embodiments, the substrate 161 includes ceramic, glass, plastic, tape, film, or other supporting materials. The substrate 161 may include conductive features (e.g., conductive lines and vias) formed in/on the substrate 161. As illustrated in FIG. 7, the substrate 161 has conductive pads 163 formed on the upper surface and a lower surface of the substrate 161, which conductive pads 163 are electrically coupled to the conductive features of the substrate 161. The one or more semiconductor dies 162 are electrically coupled to the conductive pads 163 by, e.g., bonding wires 167. A molding material 165, which may comprise an epoxy, an organic polymer, a polymer, or the like, is formed over the substrate 161 and around the semiconductor dies 162. In some embodiments, the molding material 165 may be conterminous with the substrate 161, as illustrated in FIG. 7.

In some embodiments, a reflow process is performed to electrically and mechanically couple the semiconductor package 160 to the backside redistribution structure 110. Conductive joints 168 are formed between the conductive pads 163 and the conductive feature 114. In some embodiments, the conductive joints 168 include solder regions, conductive pillars (e.g., copper pillars with solder regions on at least end surfaces of the copper pillars or TSVs), or any other suitable conductive joints.

Embodiments may achieve advantages. For example, the use of a pattern of UBM structures having a staggered arrangement (e.g., having sets of UBM structures with offsets) or having lengths dissimilar to corresponding bonded UBM structures may reduce the tilt that a device has after bonding to a substrate. In this manner, the bond between the device and the substrate may be improved, and defects in the bond may be reduced, which can improve yield. In some cases, the use of techniques described herein may allow for a bond having low resistance and low inductance. Additionally, different processing tools may not be required.

In an embodiment, a semiconductor package includes a semiconductor device including a first under bump metallization (UBM) structure, wherein the first UBM structure includes multiple first conductive strips, the first conductive strips extending in a first direction, multiple second conductive strips separated from and interleaved with the multiple first conductive strips, the second conductive strips extending in the first direction, wherein the multiple first conductive strips are offset in the first direction from the multiple second conductive strips by a first offset distance, and a substrate including a second UBM structure, the second UBM structure including multiple third conductive strips, each one of the multiple third conductive strips configured to be bonded to one of the multiple first conductive strips or one of the multiple second conductive strips. In an embodiment, the semiconductor device is an integrated passive device (IPD). In an embodiment, the substrate is an integrated fan-out (InFO) package. In an embodiment, the second UBM structure further including multiple fourth conductive strips, wherein the multiple fourth conductive strips are offset in the first direction from the multiple third conductive strips by a second offset distance. In an embodiment, the first offset distance is between about 10 µm and about 1000 µm. In an embodiment, the first UBM structure includes a semiconductor strip that has the same lateral dimensions as a semiconductor strip of the second UBM structure. In an embodiment, the multiple first semiconductor strips have a first length, wherein the multiple second semiconductor strips have the first length, and wherein the multiple third semiconductor strips have a second length that is different from the first length. In an embodiment, a difference between the first length and the second length is a distance that is less than the first offset distance.

In an embodiment, a semiconductor device includes an integrated passive device (IPD) including multiple first bonding structures and multiple second bonding structures disposed on a surface of the IPD, wherein the first bonding structures and the second bonding structures have a first length, and wherein the first bonding structures are offset from the second bonding structures by a first offset distance, and a substrate including multiple third bonding structures and multiple fourth bonding structures disposed on a surface of the substrate, wherein the third bonding structures and the fourth bonding structures have a second length that is greater than the first length, wherein the third bonding structures are offset from the fourth bonding structures by a second offset distance, and wherein each one of the multiple third bonding structures is bonded to a respective one of the multiple first bonding structures. In an embodiment, the second length is between about 10 µm and about 1000 µm greater than the first length. In an embodiment, the multiple first bonding structures is bonded to the multiple third bonding structures using a solder material. In an embodiment, each of the first bonding structures is adjacent at least one second bonding structure, and wherein each of the first bonding structures is offset in a lengthwise direction from an adjacent second bonding structure by the first offset distance. In an embodiment, the first offset distance is less than a difference between the first length and the second length. In an embodiment, the second offset distance is the same as the first offset distance. In an embodiment, the first bonding structures of the multiple first bonding structures have first ends facing a first lengthwise direction and the third bonding structures of the multiple third bonding structures have first ends facing the first lengthwise direction, and wherein the first ends of the multiple first bonding structures are aligned with the first ends of the multiple third bonding structures. In an embodiment, the first bonding structures of the multiple first bonding structures are in a parallel arrangement.

In an embodiment, a method includes forming a first pattern of first under bump metallization (UBM) structures over a semiconductor device, the first pattern of first UBM structures including parallel conductive strips, forming a second pattern of second UBM structures over a substrate, the second pattern of second UBM structures including parallel conductive strips, forming a solder material on the first UBM structures, placing the first UBM structures over the second UBM structures, wherein a first end of each of the first UBM structures is aligned with a first end of a respective second UBM structure, and wherein a second end of each of the first UBM structures is offset from a second end of a respective second UBM structure, and performing a reflow process to flow the solder material toward the second end of each of the respective second UBM structures. In an embodiment, the method also includes forming a flux material on the second UBM structures. In an embodiment, after performing the reflow process, a difference between a first distance of an end of the semiconductor device from the substrate and a second distance of an opposite end of the semiconductor device from the substrate is less than about 1000 µm. In an embodiment, the second end of each respective second UBM structure is closer to an edge of the semiconductor device than the first end of each respective second UBM structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first pattern of first under bump metallization (UBM) structures over a semiconductor device, the first pattern of first UBM structures comprising parallel conductive strips;
   forming a second pattern of second UBM structures over a substrate, the second pattern of second UBM structures comprising parallel conductive strips;
   forming a solder material on the first UBM structures;
   placing the first UBM structures over the second UBM structures, wherein a first end of each of the first UBM structures is aligned with a first end of a respective second UBM structure, and wherein a second end of each of the first UBM structures is offset from a second end of a respective second UBM structure; and
   performing a reflow process to flow the solder material toward the second end of each of the respective second UBM structures.

2. The method of claim 1, further comprising forming a flux material on the second UBM structures.

3. The method of claim 1, wherein, after performing the reflow process, a difference between a first distance of an end of the semiconductor device from the substrate and a second distance of an opposite end of the semiconductor device from the substrate is less than about 1000 μm.

4. The method of claim 1, wherein the second end of each respective second UBM structure is closer to an edge of the semiconductor device than the first end of each respective second UBM structure.

5. The method of claim 1, wherein the first pattern of first UBM structures comprises a first subset of first UBM structures and a second subset of first UBM structures, wherein the second pattern of second UBM structures comprises a first subset of second UBM structures and a second subset of second UBM structures, wherein ends of the first subset of first UBM structures are laterally offset from ends of the second subset of first UBM structures, wherein ends of the first subset of second UBM structures are laterally offset from ends of the second subset of second UBM structures.

6. The method of claim 5, wherein the first subset of first UBM structures and the second subset of first UBM structures are arranged in an alternating pattern.

7. The method of claim 6, wherein a longitudinal length of the first UBM structures is less than a longitudinal length of the second UBM structures.

8. A method comprising:
   forming a first pattern of under bump metallization (UBM) structures over a first substrate, the first pattern of UBM structures comprising:
   a first set of UBM structures having a first length; and
   a second set of UBM structures having the first length, wherein the second set of UBM structures are offset from the first set of UBM structures;
   forming a second pattern of under bump metallization (UBM) structures over a second substrate, the second pattern of UBM structures comprising:
   a third set of UBM structures having a second length; and
   a fourth set of UBM structures having the second length, wherein the third set of UBM structures are offset from the fourth set of UBM structures;
   forming solder on the first pattern of UBM structures or the second pattern of UBM structures; and
   bonding the first set of UBM structures to the third set of UBM structures using the solder and bonding the second set of UBM structures to the fourth set of UBM structures using the solder,
   wherein ends of the first UBM structures are offset from corresponding ends of the third set of UBM structures in a first direction by a first distance less than an offset between ends of the first UBM structures and corresponding ends of the third set of UBM structures in a second direction, and
   wherein ends of the second UBM structures are offset from corresponding ends of the fourth set of UBM structures in the second direction by a second distance less than an offset between ends of the second UBM structures and corresponding ends of the fourth set of UBM structures in the first direction.

9. The method of claim 8, wherein the first pattern of UBM structures comprise alternating ones of the first set of UBM structures and the second set of UBM structures.

10. The method of claim 8, wherein the first length is less than the second length.

11. The method of claim 8, wherein a difference in a first height between the first substrate and the second substrate at a first edge of the first substrate and a second height between the first substrate and the second substrate on a second edge of the first substrate is less than 1000 μm.

12. The method of claim 8, wherein the solder completely covers a bonding surface of the first set of UBM structures and a bonding surface of the third set of UBM structures.

13. The method of claim 8, wherein ends of the first set of UBM structures are aligned, and wherein ends of the second set of UBM structures are aligned.

14. A method comprising:
   forming a first pattern of first under bump metallization (UBM) structures over a first substrate, the first pattern of UBM structures comprising:
   a first UBM structure, the first UBM structure being elongated in a plan view; and
   a second UBM structure adjacent the first UBM structure, the second UBM structure being elongated in the plan view, ends of the first UBM structure being offset from ends of the second UBM structure;
   forming a second pattern of second under bump metallization (UBM) structures over a second substrate, the second pattern of UBM structures comprising:
   a third UBM structure, the third UBM structure being elongated in the plan view; and
   a fourth UBM structure adjacent the third UBM structure, the fourth UBM structure being elongated in the plan view, ends of the third UBM structure being offset from ends of the fourth UBM structure;
   forming solder on the first pattern of UBM structures or the second pattern of UBM structures; and
   bonding the first UBM structure to the third UBM structure and the second UBM structure to the fourth UBM structure using the solder, wherein after bonding:
   a first end of the first UBM structure is laterally closer to a first end of the third UBM structure than a second end of the first UBM structure is to a second end of the third UBM structure in the plan view,
   a first end of the second UBM structure is laterally closer to a first end of the fourth UBM structure than a second end of the second UBM structure is to a second end of the fourth UBM structure in the plan view, and the first end of the first UBM structure being closer to the second end of the second UBM structure than the first end of the second UBM structure in the plan view.

15. The method of claim 14, wherein the first UBM structure is shorter than the third UBM structure.

16. The method of claim 15 further comprising:
forming a fifth UBM structure on the first substrate; and
forming a sixth UBM structure on the second substrate; and
wherein bonding comprises bonding the fifth UBM structure to the sixth UBM structure, wherein the fifth UBM structure and the sixth UBM structure have a same length.

17. The method of claim 16, wherein a first end of the fifth UBM structure is aligned with the first end of the first UBM structure, wherein a second end of the fifth UBM structure is aligned with the first end of the second UBM structure.

18. The method of claim 17, wherein the sixth UBM structure, the third UBM structure, and the fourth UBM structure have a same length.

19. The method of claim 18, wherein ends of the sixth UBM structure are not aligned with either ends of the third UBM structure or fourth UBM structure.

20. The method of claim 14, wherein a length of the third UBM structure is equal to a length of the fourth UBM structure.

* * * * *